US010192355B2

United States Patent
Winnemöller et al.

(10) Patent No.: US 10,192,355 B2
(45) Date of Patent: Jan. 29, 2019

(54) PROVIDING A TUTORIAL FOR DRAWING A SCAFFOLD TO GUIDE A DRAWING OF A THREE DIMENSIONAL OBJECT

(71) Applicant: ADOBE INC., San Jose, CA (US)

(72) Inventors: Holger Winnemöller, Seattle, WA (US); Niloy Mitra, London (GB); Lubomira Dontcheva, Seattle, WA (US); James Hennessey, London (GB)

(73) Assignee: ADOBE INC., San Jose, CA (US)

( * ) Notice: Subject to any disclaimer, the term of this patent is extended or adjusted under 35 U.S.C. 154(b) by 0 days.

(21) Appl. No.: 15/407,185

(22) Filed: Jan. 16, 2017

(65) Prior Publication Data

US 2018/0204376 A1    Jul. 19, 2018

(51) Int. Cl.
*G06F 17/50* (2006.01)
*G06T 17/10* (2006.01)
*G06T 19/20* (2011.01)

(52) U.S. Cl.
CPC .............. *G06T 17/10* (2013.01); *G06T 19/20* (2013.01); *G06F 17/50* (2013.01); *G06T 2219/2004* (2013.01)

(58) Field of Classification Search
CPC ......... G06F 17/50; G06T 11/20; G06T 11/203
See application file for complete search history.

(56) References Cited

U.S. PATENT DOCUMENTS

| 7,446,780 | B1 * | 11/2008 | Everitt | G06T 15/50 345/473 |
| 2011/0285696 | A1 * | 11/2011 | Ocali | G06T 1/00 345/419 |
| 2013/0100159 | A1 * | 4/2013 | Fernquist | G06T 11/203 345/619 |
| 2014/0229143 | A1 * | 8/2014 | Cohen-Or | G06T 17/10 703/1 |

(Continued)

OTHER PUBLICATIONS

Dixon et al., "iCanDraw?—Using Sketch Recognition and Corrective Feedback to Assist a User in Drawing Human Faces", CHI 2010, Apr. 10-15, 2010, Atlanta, Georgia, USA.

(Continued)

*Primary Examiner* — Thomas J Lett
(74) *Attorney, Agent, or Firm* — Brake Hughes Bellermann LLP

(57) ABSTRACT

The systems and techniques disclosed herein provide tutorials for drawing three dimensional objects with accurate proportions and perspective. A user is able to select an object and a viewpoint to automatically generate a tutorial. Regardless of the object and viewpoint, an easy-to-use tutorial is produced that guides the user to draw the object with accurate proportions and perspective. Given a segmented 3D model of the object and a camera viewpoint, a sequence of steps for constructing the scaffold is determined. The sequence of steps is based on an intelligent selection of primitives and inter-primitive anchorings that provides an order for drawing the primitives and makes the scaffold easy to construct. The primitives and inter-primitive anchorings (Continued)

are selected from a rich set of possibilities that allow for some inaccuracies to reduce the difficulty of the tutorial. The primitives and inter-primitive anchoring are selected to balance the difficulty and the potential inaccuracy.

20 Claims, 6 Drawing Sheets

(56) References Cited

U.S. PATENT DOCUMENTS

2015/0370924 A1\* 12/2015 Kontturi ................ G06F 17/50
703/1

OTHER PUBLICATIONS

Fernquist et al., "Sketch-Sketch Revolution: An Engaging Tutorial System for Guided Sketching and Application Learning", UIST '11, Oct. 16-19, 2011, Santa Barbara, CA, USA.

Flagg et al., "Projector-Guided Painting", UIST'06, Oct. 15-18, 2006, Montreux, Switzerland.

Iarussi et al., "The Drawing Assistant: Automated Drawing Guidance and Feedback from Photographs", ACM Symposium on User Interface Software and Technology (UIST), Oct. 2013, St Andrews, United Kingdom. ACM, 2013. <hal-00840853v2>.

Lee et al., "ShadowDraw: Real-Time User Guidance for Freehand Drawing", ACM Trans. Graph. 30, 4 (Jul. 2011).

\* cited by examiner

PROVIDING A TUTORIAL FOR DRAWING A SCAFFOLD TO GUIDE A DRAWING OF A THREE DIMENSIONAL OBJECT

TECHNICAL FIELD

This disclosure relates generally to systems and techniques that help users learn to draw three dimensional objects and more particularly relates to assisting users in drawing and using scaffolds that guide the drawing of three dimensional objects.

BACKGROUND

The ability to draw three dimensional objects is a useful and important skill for product designers, artists, hobbyists, and other individuals. Drawing techniques that are used to accurately draw three dimensional objects are often not intuitive and generally require a significant amount of training and practice. Novices generally lack an understanding of the concepts of perspective and do not know how to measure and transfer proportions accurately. Consider an example of a wall that has a window directly in its center. If the wall is drawn from a perspective in which the left side of the wall is closer than the right side of the wall, the center of the wall will not be equidistant from the left and right sides of the wall in the drawing. Drawing the window at such a location would not provide an accurate drawing.

To ensure accurate proportions and perspective in their drawings, experienced artists learn various drawing techniques. Some coarse-to-fine drawing techniques, for example use scaffolds to ensure accurate proportions and perspective. A scaffold typically includes a preliminary sketch of basic geometric shapes (referred to herein as "primitives") such as planes, cuboids, cylinders, and truncated pyramids that represent the general shapes of different parts of the object. Guidelines are used to ensure that the primitives are drawn with accurate perspective and proportion relative to one another. The contour lines of the actual parts of the object are drawn using the primitives for reference. The primitives of the scaffold can then be erased, leaving an accurate drawing of the object. In the wall/window example above, such a drawing technique can be used to ensure the window is drawn in an appropriate position relative to the wall and with accurate size and dimension. A plane-shaped primitive representing the general shape of the wall is first drawn. Diagonal guidelines connecting opposing corners of the primitive are then drawn and the center of the wall is identified using the intersection of the diagonal guidelines. A second primitive representing the general shape of the window is next drawn relative to the identified center of the wall. Finally, the details of the wall and window are drawn relative to the primitives and the primitives are erased. The resulting drawing accurately represents perspective and proportion.

While there are many books and videos that provide drawing tutorials, effective tutorials are difficult and time consuming to produce and often fail to offer tutorial content that is engaging to novices learning to draw. A tutorial author must carefully select an object and viewpoint, and then produce instructions for a sequence of steps that teach how to draw the object from the viewpoint. The tutorial is consequently limited to the particular object being drawn from the particular viewpoint. These limitations can reduce the appeal of the tutorial to novices learning to draw. It will often be more interesting for novices to learn by drawing objects that are of interest to them than by drawing the object in the tutorial. A novice interested in race cars will be less engaged by a tutorial for drawing a toaster than a tutorial for drawing a race car. Similarly, a novice may be more interested in drawing an object from his own selected viewpoint than using the viewpoint selected by the author of the tutorial.

Existing techniques that use computers to automatically generate tutorials allow experts to create tutorials for novices. However, such techniques generally fail to provide sufficient flexibility with respect to allowing a user to select an object and viewpoint for the tutorial. The types and characteristics of the objects used to automatically generate tutorials are limited. The techniques also often focus on stroke correction and beautification and do not provide adequate instructions for teaching novices to draw three dimensional objects with accurate proportions and perspective.

SUMMARY

The systems and techniques disclosed herein provide tutorials for drawing three dimensional objects with accurate proportions and perspective. A user is able to select an object and a viewpoint to automatically generate a tutorial. Regardless of the object and viewpoint, an easy-to-use tutorial is produced that guides the user to draw the object. The tutorial guides the user to draw a scaffold of basic object shapes (i.e., primitives), which helps the user draw the final contours of the object in correct perspective and proportion. Given a segmented three dimensional model of an object and a camera viewpoint, a sequence of steps for constructing a scaffold is determined. The sequence of steps is based on an intelligent selection of primitives and inter-primitive anchorings. The inter-primitive anchorings provide an order for drawing the primitives such that those drawn later can be easily anchored (i.e., drawn with guidance) off already drawn primitives. The primitives and inter-primitive anchorings are selected from many possibilities, including possibilities that allow for some inaccuracies. Allowing slight inaccuracies can reduce the difficulty of the tutorial but may distort the appearance of the drawing. The primitives and inter-primitive anchoring are selected to balance the difficulty and the potential inaccuracy. The tutorials that are produced using such selections are both easy to use and sufficiently accurate so that any differences between the drawings and the object's actual appearance are generally difficult to detect without measuring.

One exemplary technique provides a tutorial for drawing a scaffold to guide a drawing of a three dimensional object. The technique involves determining primitives for the object. The primitives include original primitives and modified primitives. The original primitives represent the general shapes of the parts of the object. The modified primitives represent the shapes of the parts of the object with modifications. Using both the original and modified shapes allows primitives to be selected for the scaffold with some inaccuracies that may make the primitives easier to draw. The technique determines accuracy values of the primitives so that the accuracy of the primitives can be taken into account in selecting which of the primitives will be used in the tutorial. The technique further involves determining inter-primitive anchoring options for the primitives and determining difficulty values for the inter-primitive anchoring options. Multiple sets of primitives using different inter-primitive anchoring options are evaluated to consider alternative ways of drawing the scaffold for the object. The exemplary technique selects a set of the primitives and inter-primitive anchoring options for the tutorial. The set is selected based on the accuracy values of the primitives and the difficulty values of the inter-primitive anchoring options. The exemplary technique then uses the primitives and inter-primitive anchoring options of the set to provide a tutorial for drawing the scaffold.

These illustrative features are mentioned not to limit or define the disclosure, but to provide examples to aid understanding thereof. Additional embodiments are discussed in the Detailed Description, and further description is provided there.

BRIEF DESCRIPTION OF THE FIGURES

These and other features, embodiments, and advantages of the present disclosure are better understood when the following Detailed Description is read with reference to the accompanying drawings.

DETAILED DESCRIPTION

Figure 1:
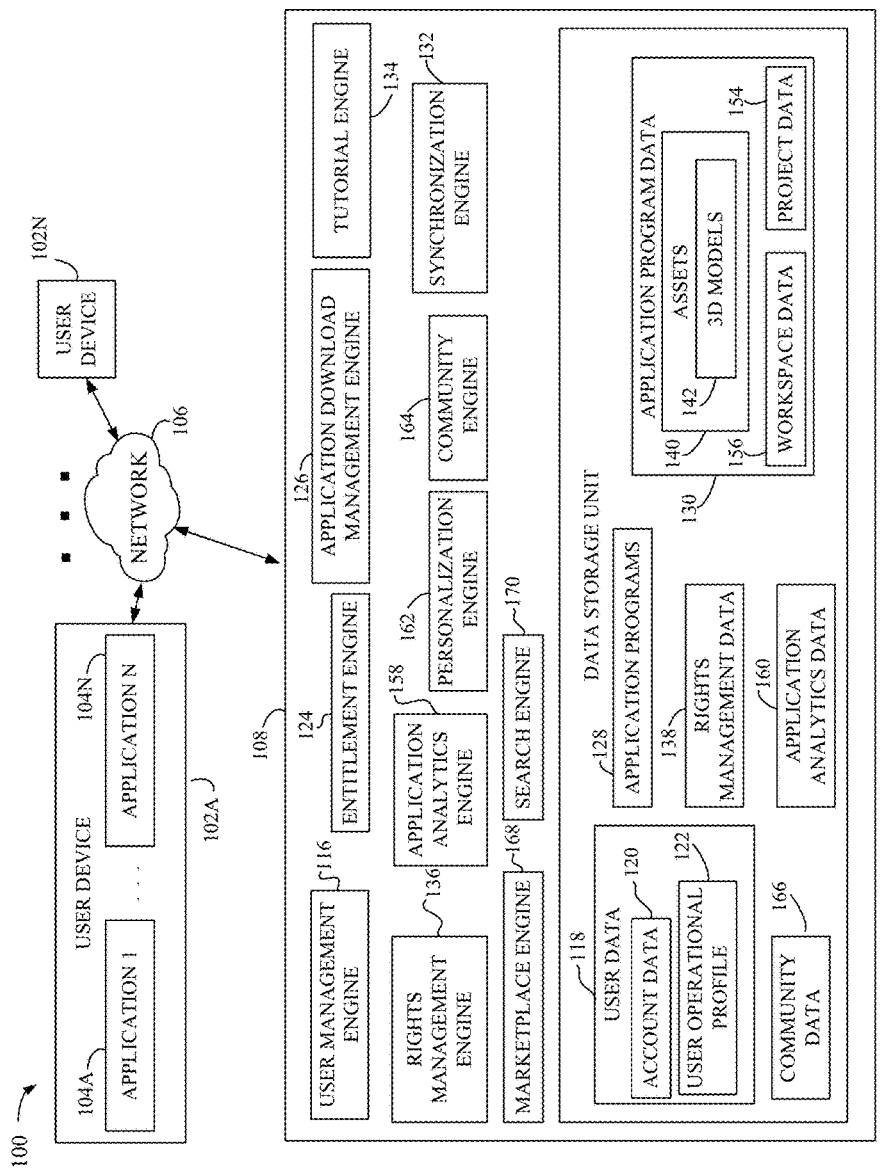
FIG. 1 is a diagram of an environment in which one or more techniques of the invention can be practiced.

The systems and techniques disclosed herein provide tutorials for drawing three dimensional objects with accurate proportions and perspective. A user is able to select an object and a viewpoint to automatically generate a tutorial. Regardless of the object and viewpoint, the techniques of the invention are able to generate an easy-to-use tutorial that guides the user to draw the object with accurate proportions and perspective. A user who is interested in race cars can automatically create and use a tutorial for drawing a race car, for example, based on a 3D model of his own car. The tutorial guides the user to draw a scaffold of basic object shapes (i.e., primitives), which helps the user draw the final contours of the object in correct perspective and proportion.

Given a segmented 3D model of an object and a camera viewpoint, a sequence of steps for constructing a scaffold for the object is determined. The sequence of steps is based on an intelligent selection of primitives and inter-primitive anchorings that provides an order for drawing the primitives and makes the scaffold easy to construct. The inter-primitive anchorings identify how to draw the primitives based on previously-drawn primitives. The sequence of steps is based on intelligently selected inter-primitive anchorings that provide an easy-to-follow order for drawing the scaffold such that those drawn later can be easily anchored (i.e., drawn with guidance) off already drawn primitives. The primitives and inter-primitive anchorings are selected from numerous possibilities to identify a sequence of steps for drawing the scaffold that is easy-to-draw and accurate. Some of the possibilities for primitives for the scaffold include inaccuracies. For example, multiple primitives are considered to represent the general shape of one part of the object. Some of these primitives will more accurately represent the general shape of the part than other primitives. For example, for a given part, there may be one primitive that outlines its shape precisely, another primitive that is slightly larger, another primitive that is slightly smaller, another primitive that has one edge slightly further out, etc. These variations are created because it may be beneficial to select a slightly inaccurate primitive for the part. Allowing slight inaccuracies can significantly simplify the drawing techniques without significantly altering the appearance of the drawing. This enables the creation of a tutorial that uses relatively easy drawing techniques for an object that would otherwise require very difficult drawing techniques. As a result, easy-to-use tutorials can be automatically produced for any object and viewpoint. While reducing difficulty by allowing slight inaccuracies is beneficial, allowing large inaccuracies that would significantly alter the appearance of the drawing is avoided. Techniques of the invention select primitives and inter-primitive anchorings by balancing primitive inaccuracy with inter-primitive anchoring difficulty. The resulting tutorials are both easy to use and sufficiently accurate so that any differences between the drawings and the object's actual appearance are generally difficult to detect without measuring.

The scaffolds used to provide the tutorials include primitives that represent the general shapes of the parts of an object. For example, a cylinder-shaped primitive may represent the shape of a teapot spout part of a tea pot object. The primitive is drawn to provide a guide for drawing the contours of the associated part of the object. The user first draws the cylinder-shaped primitive with accurate proportions and perspective and then draws contour lines representing the actual shape of the teapot spout relative to the cylinder-shaped primitive. Using the primitive as a guide ensures that the teapot spout has accurate proportions and perspective. Scaffolds are drawn by drawing the primitives for an object in a sequence so that at least some of the primitives can be drawn based on previously-drawn primitives as drawing guides. For example, an exemplary tutorial may provide instructions to draw a first primitive, draw guidelines relative to the first primitive to identify halfway point or a ⅓ point along the width of the first primitive, and draw a second primitive using the identified halfway point or ⅓ point. By drawing primitives in relative positions to one another to form a scaffold and then drawing the object based on the scaffold, the user practices techniques for drawing the object with accurate proportions and perspective.

Techniques of the invention automatically identify a scaffold used to guide the drawing of an object. The techniques intelligently select primitives and inter-primitive anchoring for drawing the scaffold. The inter-primitive anchorings specify how some of the primitives will be drawn using previously-drawn primitives as drawing guides. For example, inter-primitive anchorings can involve using guidelines drawn relative to a previously-drawn primitive to ensure proper proportions and perspective for another primitive. Such guideline-based drawing techniques can be used to position a side line of a primitive in a precise location based on the center of another, previously-drawn primitive. Using guideline-based drawing techniques, it is straightforward to find the center or ⅓ line of a primitive in a plane for any viewpoint. It is possible to use guidelines to find a position relative to an already-drawn primitive that represents any ratio (e.g., 1/2, 1/3, 1/4 1/5, etc.) of a primitive's height or width. However, guidelines for some ratios are easier to construct than others. For example, identifying a line representing the center of a primitive generally requires the fewest guidelines, making it the easiest inter-primitive anchoring. Identifying lines for complex ratios, such as 5/32, requires many more guidelines, which increases the drawing difficult and expected drawing inaccuracy. Identifying lines for a complex ratio that involves many guidelines will often be counter-productive since the expected drawing inaccuracy resulting from using many guidelines outweighs the intended precision of the ratio.

Techniques of the invention intelligently select primitives and inter-primitive anchorings to determine an easy-to-draw scaffold for any object and viewpoint. To do so, the techniques select from many potential primitives. The techniques consider primitives that are determined to accurately represent the general shapes of the parts of the object. This generally involves identifying a primitive having a type, size, and position that best fits each part in a 3D model of the object. In one example, for each part, a least-squares technique is used to fit different primitive types to the part and the primitive type with the least residue is selected for the part. In this way a best-fitting primitive (i.e., with the best primitive type, size, and position) is identified for each part. These "original" primitives can be selected for the parts of the object to provide a scaffold for drawing the object. However, in addition to these original primitives, the techniques also consider modified primitives for one or more of the parts of the object. In one embodiment, modified primitives are created by modifying an original primitive to provide new primitives with one or more different axes, sides, and/or lines. Using a modified primitive instead of an original primitive to construct the scaffold could reduce the difficulty of drawing the scaffold by allowing a less complex inter-primitive anchoring to be used. For example, a first modified primitive may have a bottom line that is 0.1 cm lower than the original primitive, a second modified primitive may have a bottom line that is 0.2 cm lower than the original primitive, etc. In one example, using the first modified primitive instead of the original primitive allows an inter-primitive anchoring based on a 1/2 ratio line to be used rather than an inter-primitive anchoring based on a 15/32 ratio line. Using modified primitives can significantly reduce the number of guidelines needed and thus the difficulty of drawing the scaffold, without significantly distorting the drawing.

The techniques of the invention also consider multiple inter-primitive anchoring options for each of the primitives, including the original and modified primitives. The term "candidate" is used herein to refer to an individual primitive using a particular inter-primitive anchoring option as a drawing guide. A given multi-part object will have numerous candidates. Each part of the object will have multiple potential primitives and each of those primitives may have multiple potential inter-primitive anchoring options. Each candidate essentially represents one way to draw a primitive for a part of the object. For example, for a spout part of a teapot object, a first candidate will include an original primitive drawn using a first inter-primitive anchoring option, a second candidate will include the original primitive drawn using a second inter-primitive anchoring option, a third candidate will include a modified primitive using a third inter-primitive anchoring option, a fourth candidate will include the modified primitive using a fourth inter-primitive anchoring option. Different sets of candidates represent different potential scaffolds for the object. In each of the sets of candidates there is one primitive for each part of the object.

Techniques of the invention intelligently select a scaffold for a tutorial by evaluating different sets of primitives and inter-primitive anchoring options. In one embodiment of the invention, a set is selected based on the difficulty of using the inter-primitive anchoring options of the sets. Difficulty costs of the inter-primitive anchoring options are determined and used to compare the different sets with respect to difficulty. In one embodiment, the overall difficulty of each of the sets is assessed by assigning costs to the difficulty of the inter-primitive anchoring options in each of the sets. An inter-primitive anchoring option requiring a 1/2 ratio line is assigned a low cost, a 1/3 ratio line is assigned a slightly higher cost, etc. The costs for different types of inter-primitive anchoring options represent their relative difficulties. A difficulty cost representing the overall difficulty of each set is computed by summing the costs associated with the inter-primitive anchoring options used in each set. The difficulty costs representing the overall difficulties of the sets can then be used to select which of the sets to use for the tutorial.

Techniques of the invention also select the set of candidates for the tutorial based on the accuracy of the sets of candidates. Many of the candidates include modified primitives that have deviations from the original primitives for a respective part. These deviations may result in inaccuracies in the drawing. In many cases, the inaccuracies are insubstantial and the benefit of simplifying the drawing technique by using a modified primitive outweighs the inaccuracy. However, large inaccuracies that would significantly alter the appearance of the drawing are avoided. To avoid using large inaccuracies, techniques of the invention determine accuracy values for the primitives and use these accuracy values to compare the accuracy of different sets. The accuracy values can be used to determine inaccuracy costs. In one example, original primitives are assigned a zero cost and modified primitives are assigned relatively larger costs based on their deviations from original primitives. For example, greater costs are assigned based on how much a center of a modified primitive is moved relative to the center of a corresponding original primitive. Inaccuracy costs representing the overall inaccuracy of each set of candidates are computed by summing the costs associated with the primitives used in each set. The inaccuracy costs represent the overall accuracies of the sets can then be used to select which of the sets of candidates to use for the tutorial.

Techniques of the invention identify a scaffold that is easy-to-draw and that accurately represents an object by selecting a set of candidates based both on difficulty and accuracy. In one embodiment, a selection problem is used to evaluate multiple sets of candidates representing different scaffolds for an object based on both the difficulty and the accuracy of the sets. The technique determines difficulty costs that represent the difficulty of inter-primitive anchoring options in each set and inaccuracy costs that represent the inaccuracies of the primitives in each set. These costs are considered together in a selection problem that identifies the set of candidates that has a lowest combined difficulty cost and inaccuracy cost. Solving the selection problem finds a set of candidates that provides an optimal balance of difficulty and inefficiency.

The set of candidates that is selected provides a set of selected primitives that use selected inter-primitive anchoring options. These selections provide all the necessary information for automatically guiding a drawing of a scaffold that includes the selected primitives. The selected set of candidates implicitly provides an ordering for drawing the primitives and information specifying the placement and scales of the primitives. The selected set of candidates can thus be used to automatically generate a tutorial that guides a user to draw the scaffold by drawing the selected primitives using the selected inter-primitive anchoring options. In one embodiment, the tutorial comprises steps for a novice to follow to draw the scaffold by drawing the selected primitives using steps that correspond to the selected inter-primitive anchoring options. In another embodiment, the tutorial comprises automatically generated graphics or animations that demonstrate how to draw each of the primitives using the selected inter-primitive anchoring options.

Terminology

As used herein, the phrase "computing device" refers to any electronic component, machine, equipment, or system that can be instructed to carry out operations. Computing devices will typically, but not necessarily, include a processor that is communicatively coupled to a memory and that executes computer-executable program code and/or accesses information stored in memory or other storage. Examples of computing devices include, but are not limited to, desktop computers, laptop computers, server computers, tablets, telephones, mobile telephones, televisions, portable data assistant (PDA), e-readers, portable game units, smart watches, etc.

As used herein, the phrase "three dimensional object" refers to a real or artificial object that has length, depth, and height. Examples of three dimensional objects include houses, buildings, vehicles, aircrafts, appliances, furniture, household items, plants, and people.

As used herein, the phrase "tutorial" refers to a sequence of steps that guides a user. Tutorials can present the sequence of steps in a variety of forms. As examples, a tutorial may be presented on a computing device as part of a document, slide presentation, video, or application. A tutorial may present a step using text, graphics, sound, video, or a combination of text, graphics, sound, and/or video.

As used herein, the phrase "scaffold" refers to one or more basic geometric shapes such as planes, cuboids, cylinders, and truncated pyramids (referred to herein as "primitives") that are drawn to guide drawing of an object. The primitives generally represent the general shapes of different parts of the object. The contour lines of the actual parts of the object are drawn using the scaffold's primitives for reference. The primitives of the scaffold can then be erased, leaving an accurate drawing of the object.

As used herein, the phrase "primitive" refers to a geometric shape that represents the general shape of a part of an object. Examples of primitives include, but are not limited to, planes, cuboids, cylinders, and truncated pyramids.

As used herein, the phrases "inter-primitive anchoring" and "inter-primitive anchoring option" refer to a particular way of drawing one primitive based on a previously-drawn primitive. For example, an inter-primitive anchoring can specify that a primitive should be drawn with its center at the center of an already-drawn primitive.

As used herein, the phrase "candidate" refers to an individual primitive using a particular inter-primitive anchoring option as a drawing guide. A given multi-part object will have numerous candidates. Each part of the object will have multiple potential primitives and each of those primitives may have multiple potential inter-primitive anchoring options. Each candidate essentially represents one way to draw a primitive for a part of the scaffold. For example, for a spout part of a teapot object, a first candidate will include an original primitive drawn using a first inter-primitive anchoring option, a second candidate will include the original primitive drawn using a second inter-primitive anchoring option, a third candidate will include a modified primitive using a third inter-primitive anchoring option, a fourth candidate will include the modified primitive using a fourth inter-primitive anchoring option. Different sets of candidates represent different potential scaffolds for the object.

Exemplary Computing Environment

FIG. 1 is a diagram of an environment 100 in which one or more embodiments of the present disclosure can be practiced. The environment 100 includes a creative apparatus that supports various creative functions performed by users using one or more user devices, such as a user device 102A up to a user device 102N. The creative functions, for example, can enable users to create and use a tutorial by identifying a three dimensional object and a viewpoint for the tutorial.

Each of the user devices is connected to a creative apparatus 108 via a network 106. Users of the user devices 102 uses various products, applications, or services supported by the creative apparatus 108 via the network 106. The user devices 102 correspond to various users. Examples of the users include, but are not limited to, creative professionals or hobbyists who use creative tools to generate, edit, track, or manage creative content, end users, administrators, users who use document tools to create, edit, track, or manage documents, advertisers, publishers, developers, content owners, content managers, content creators, content viewers, content consumers, designers, editors, any combination of these users, or any other user who uses digital tools to create, view, edit, track, or manage digital experiences.

Digital tool, as described herein, includes a tool that is used for performing a function or a workflow electronically. Examples of the digital tool include, but are not limited to, content creation tool, content editing tool, content publishing tool, content tracking tool, content managing tool, content printing tool, content consumption tool, tutorial creation tool, any combination of these tools, or any other tool that can be used for creating, editing, managing, generating, tracking, consuming or performing any other function or workflow related to content. Digital tools include the creative apparatus 108.

Digital experience, as described herein, includes experience that can be consumed through an electronic device. Examples of the digital experience include content creating, content editing, content tracking, content publishing, content posting, content printing, content managing, content viewing, content consuming, any combination of these experiences, or any other workflow or function that can be performed related to content.

Content, as described herein, includes electronic content. Examples of the content include, but are not limited to, image, video, website, webpage, user interface, menu item, tool menu, magazine, slideshow, animation, social post, comment, blog, data feed, audio, advertisement, vector graphic, bitmap, document, any combination of one or more content, or any other electronic content.

Examples of the user devices 102A-N include, but are not limited to, a personal computer (PC), a tablet computer, a desktop computer, a processing unit, any combination of these devices, or any other suitable device having one or more processors. Each user device includes at least one application supported by the creative apparatus 108.

It is to be appreciated that following description is now explained using the user device 102A as an example and any other user device can be used.

Examples of the network 106 include, but are not limited to, internet, local area network (LAN), wireless area network, wired area network, wide area network, and the like.

The creative apparatus 108 includes one or more engines for providing one or more digital experiences to the user. The creative apparatus 108 can be implemented using one or more servers, one or more platforms with corresponding application programming interfaces, cloud infrastructure and the like. In addition, each engine can also be implemented using one or more servers, one or more platforms with corresponding application programming interfaces, cloud infrastructure and the like. The creative apparatus 108 also includes a data storage unit 112. The data storage unit 112 can be implemented as one or more databases or one or more data servers. The data storage unit 112 includes data that is used by the engines of the creative apparatus 108.

The tutorial engine 134 of the creative apparatus is used by a user to create and use a tutorial for drawing a three dimensional object. The tutorial engine 134 receives input from the user selecting an object and a viewpoint, and automatically generates a tutorial for drawing the object from the viewpoint. The tutorial guides the user to draw a scaffold of basic object shapes (i.e., primitives), which helps the user draw the final contours of the object in correct perspective and proportion. Given a segmented three dimensional model of an object and a viewpoint, the tutorial engine 134 creates a sequence of steps for constructing a scaffold for the object. The sequence of steps is based on an intelligent selection of primitives and inter-primitive anchorings that provides an order for drawing the primitives and makes the scaffold easy to construct. The tutorial engine 134 selects primitives and inter-primitive anchorings by balancing primitive inaccuracy with inter-primitive anchoring difficulty. The resulting tutorials are both easy to use and accurate.

The creative apparatus 108 provides numerous other features that enhance the user's experiences in learning to draw and other creative endeavors. The user operates user device 102A to visit a webpage or an application store to explore applications supported by the creative apparatus 108. The creative apparatus 108 provides the applications as a software as a service (SaaS), or as a standalone application that can be installed on the user device 102A, or as a combination. The user creates an account with the creative apparatus 108 by providing user details and also by creating login details. Alternatively, the creative apparatus 108 can automatically create login details for the user in response to receipt of the user details. In some embodiments, the user is also prompted to install an application manager. The application manager enables the user to manage installation of various applications supported by the creative apparatus 108 and also to manage other functionalities, such as updates, subscription accounts and the like, associated with the applications. The user details are received by a user management engine 116 and stored as user data 118 in the data storage unit 112. In some embodiments, the user data 118 further includes account data 120 under which the user details are stored.

The user can either opt for a trial account or can make payment based on type of account or subscription chosen by the user. Alternatively, the payment can be based on a product or number of products chosen by the user. Based on payment details of the user, a user operational profile 122 is generated by an entitlement engine 124. The user operational profile 122 is stored in the data storage unit 112 and indicates entitlement of the user to various products or services. The user operational profile 122 also indicates type of user, i.e. free, trial, student, discounted, or paid.

The user then installs various applications supported by the creative apparatus 108 via an application download management engine 126. Application installers or application programs 128 present in the data storage unit 112 are fetched by the application download management engine 126 and made available to the user directly or via the application manager. In one embodiment, all application programs 128 are fetched and provided to the user via an interface of the application manager. In another embodiment, application programs 128 for which the user is eligible based on user's operational profile are displayed to the user. The user then selects the application programs 128 or the applications that the user wants to download. The application programs 128 are then downloaded on the user device 102A by the application manager via the application download management engine 126. Corresponding data regarding the download is also updated in the user operational profile 122. An application program 128 is an example of the digital tool. The application download management engine 126 also manages the process of providing updates to the user device 102A.

Upon download, installation and launching of an application program, in one embodiment, the user is asked to provide login details. A check is again made by the user management engine 116 and the entitlement engine 124 to ensure that the user is entitled to use the application program. In another embodiment, direct access is provided to the application program as the user is already logged into the application manager.

The user uses one or more application programs 128 to create one or more projects or assets. In addition, the user also has a workspace within each application program. The workspace, as described herein, includes setting of the application program, setting of tools or setting of user interface provided by the application program, and any other setting or properties specific to the application program. Each user has a workspace.

The application program data 130 includes one or more assets 140. The assets 140 can be a shared asset which the user wants to share with other users or which the user wants to offer on a marketplace. The assets 140 can also be shared across multiple application programs 128. Examples of the assets 140 include, but are not limited to, three dimensional models of objects. For example, the assets can include a large collection of three dimensional models of objects that a user can select from to generate a tutorial.

The application program data 130 also include project data 154 and workspace data 156. In one embodiment, the project data 154 includes the assets 140. In another embodiment, the assets 140 are standalone assets. Similarly, the workspace data 156 can be part of the project data 154 in one embodiment while it may be standalone data in another embodiment.

In some embodiments, the user interaction with the application programs 128 is also tracked by an application analytics engine 158 and stored as application analytics data 160. The application analytics data 160 includes, for example, usage of a tool, usage of a feature, usage of a workflow, usage of the assets 140, and the like. The application analytics data 160 can include the usage data on a per user basis and can also include the usage data on a per tool basis or per feature basis or per workflow basis or any other basis. The application analytics engine 158 embeds a piece of code in the application programs 128 that enables an application program to collect the usage data and send it to the application analytics engine 158. The application analytics engine 158 stores the usage data as the application analytics data 160 and processes the application analytics data 160 to draw meaningful output. For example, the application analytics engine 158 can draw an output that the user uses "Tool 4" a maximum number of times. The output of the application analytics engine 158 is used by a personalization engine 162 to personalize the tool menu for the user to show "Tool 4" on top. Other types of personalization can also be performed based on the application analytics data 158. In addition, the personalization engine 162 can also use the workspace data 156 or the user data 118 including user preferences to personalize one or more application programs 128 for the user.

The creative apparatus 108 also includes a community engine 164 which enables creation of various communities and collaboration among the communities. A community, as described herein, includes a group of users that share at least one common interest. The community can be closed, i.e. limited to a number of users, or can be open, i.e. anyone can participate. The community enables the users to share each other's work and comment or like each other's work. The work includes the application program data 140. The community engine 164 stores any data corresponding to the community, such as work shared on the community and comments or likes received for the work as community data 166. The community data 166 also includes notification data and is used for notifying other users by the community engine in case of any activity related to the work or new work being shared. The community engine 164 can provide collaborative workflows to the user. For example, the user can create an image and can request for some expert opinion or expert editing. An expert user can then either edit the image as per the user liking or can provide expert opinion. In collaborative workflows, each of a plurality of users are assigned different tasks related to the work.

The creative apparatus 108 also includes a marketplace engine 168 for providing a marketplace to one or more users. The marketplace engine 168 enables the user to offer an asset for sale or use. The marketplace engine 168 has access to the assets 140 that the user wants to offer on the marketplace. The creative apparatus 108 also includes a search engine 170 to enable searching of the assets 140 in the marketplace. The search engine 170 is also a part of one or more application programs 128 to enable the user to perform search for the assets 140 or any other type of the application program data 130. The search engine 170 can perform a search for an asset using the metadata 142 or the file.

It is to be appreciated that the engines and working of the engines are described as examples herein and the engines can be used for performing any step in providing a digital experience to the user.

Exemplary Techniques for Providing Easy-to-Use Tutorials

Accurately drawing three dimensional objects is difficult for untrained individuals, as it requires an understanding of perspective and its effects on geometry and proportions. Step-by-step tutorials break the complex task of drawing an entire object down into easy-to-follow steps that even a novice can follow. In the past, creating such tutorials has been a time consuming task requiring expert knowledge. As a result, the availability of tutorials for a given object or viewpoint is limited. Techniques of the invention automatically generate easy-to-follow tutorials for arbitrary three dimensional objects. Given a segmented 3D model and a viewpoint, techniques of the invention compute a sequence of steps for constructing a scaffold comprised of geometric primitives, which helps the user draw the final contours in correct perspective and proportion. To make the drawing scaffold easy to construct, techniques of the invention determine an ordering among the scaffolding primitives and make small geometric modifications to the sizes and/or locations of the primitives used for the object parts to simplify their relative positioning. A single selection problem is solved to provide an ordering of primitives used to draw a scaffold using selected primitives and primitive anchoring option that make the tutorial easy to use, while also ensuring that the primitives accurately represent the shapes of the parts of the object.

Techniques of the invention produce tutorials with characteristics that make the tutorials easy to follow. The tutorials guide a user to draw a scaffold and then to use the scaffold to draw the detailed contour lines that provide the actual shape of the object. The tutorials proceed in a coarse-to-fine fashion, in which object parts are abstracted as primitives over several levels of detail to build up the scaffold. The tutorials are based on intelligently selected inter-primitive anchorings that provide an easy-to-follow order for drawing the scaffolding such that those drawn later can be easily anchored (i.e., drawn with guidance) off already drawn primitives. The tutorials can provide varying levels of instruction to accommodate users of different skill levels, e.g., beginner, intermediate, expert, etc. For example, the tutorial can provide a tutorial tailored to a beginner with explicit steps for the construction of guidelines to accurately anchor the scaffolding primitives or a tutorial tailored to an expert without such guidelines.

Techniques of the invention intelligently select the primitives and inter-primitive anchorings for a tutorial by favoring the use of such easy-to-use ratios and otherwise favoring using inter-primitive anchoring techniques that are relatively easy-to-use. The difficulty of the inter-primitive anchoring techniques depends on the complexity of the anchoring technique and the number and complexity of guidelines used. In easy-to-follow tutorials, the dimensions and arrangements of object parts tend to have ratios that are easy to construct using relatively few guidelines. For example, it is easier to construct the center line of a rectangular face compared to its one fifth line.

Figure 2:
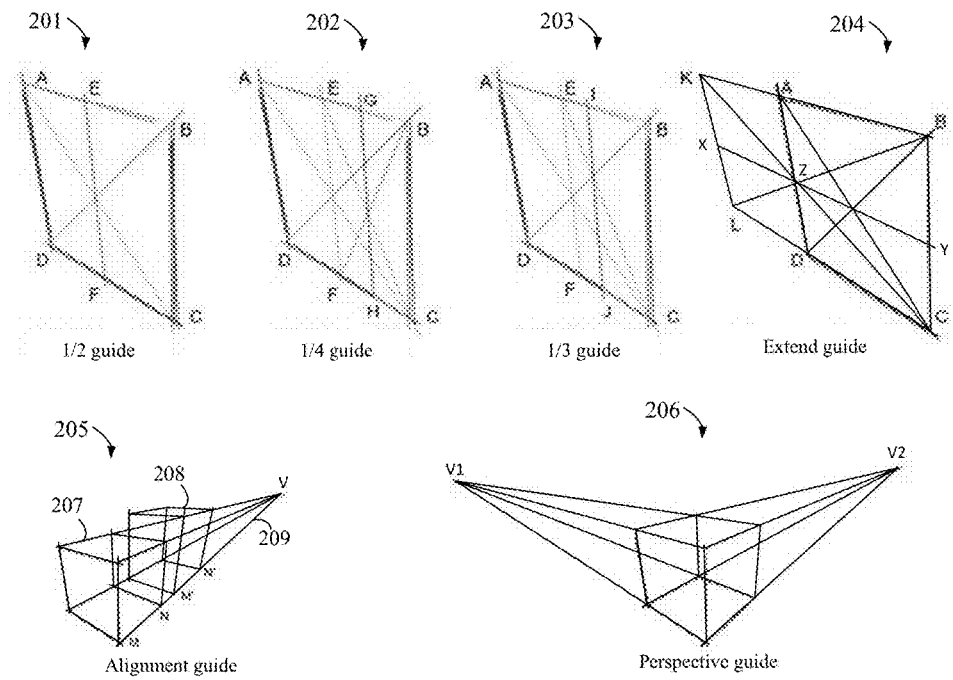
FIG. 2 is set of a graphical depiction illustrating guideline techniques of varying difficulties that can be used in inter-primitive anchorings.

FIG. 2 is set of a graphical depiction 201-206 illustrating guideline techniques of varying difficulties that can be used in inter-primitive anchorings. Given a primitive having a face formed by ABCD, guidelines can be used to identify positions for lines at various positions relative to the face. In graphical depiction 201, a diagonal guideline is drawn between points B and D and another diagonal guideline is drawn between points A and C. A center or ½ line EF can then be drawn based on the intersection of these diagonal guidelines. In graphical depiction 202, two levels of ½ lines are drawn to produce a ¼ line GH. Specifically, a diagonal guideline is drawn between points B and F and another diagonal guideline is drawn between point E and point C. The ¼ line GH can then be drawn based on the intersection of these diagonal guidelines. In graphical depiction 203 guidelines are drawn to produce a ⅓ line IJ. Specifically, a guideline is drawn between points B and D and another guideline is drawn between points C and E. The ⅓ line IK can then be drawn based on the intersection of these diagonal guidelines.

Graphical depiction 204 illustrates an extrusion towards a vanishing point where ABCD is extended by reflection to form BCLK such that AB=AK. In this example guidelines AC and BD are drawn to identify the center of ABCD. A horizontal ½ line ZY is drawn based on this center though point Y. A guideline through CZ is drawn and extended past Z. Another guideline is drawn to extent the line from B to A out beyond A. These guidelines intersect at point K. In this way, a position for point K is determined such that AB=AK. A similar technique is used to determine a position for point L. Specifically, a guideline through BZ is drawn and extended past Z. Another guideline is drawn to extent the line from C to D out beyond D. These guidelines intersect at point L. In this way, a position for point L is determined such that CD=DL.

Graphical depiction 205 illustrates a tutorial using alignment guidelines to support alignment of two primitives. In this example, the first primitive 207 includes line MN. Guidelines are dawn extending the edge lines of the primitive to an intersection at vanishing point V. These guidelines can then be used to guide the drawing of a second primitive 208. In the example, illustrated in graphical depiction 205, the guideline 209 that extends through MN to vanishing point V is used to guide the drawing of line M'N' in the second primitive 208. Graphical depiction 206 illustrates a tutorial providing guidelines to identify vanishing points. The guidelines used in a tutorial can support drawing in either 2-point perspective or 3-point perspective.

Techniques of the invention provide a tutorial of steps based on a selection of primitives and inter-primitive anchoring options. To do so, the techniques identify numerous possible primitives, including primitives with inaccuracies, and generate candidates using the primitives with different inter-primitive anchoring options. Inter-primitive anchoring options often require drawing guidelines and some guideline techniques are easier to use than others, as illustrated in FIG. 2. Techniques of the invention select primitives and inter-primitive anchorings that use easy-to-construct guidelines, such as guidelines that use the top edge, bottom edge, center line, etc., of existing primitives. Techniques of the invention can consider numerous possibilities for the primitives and inter-primitive anchorings. A set of the primitives and inter-primitive anchoring options can be selected using various criteria. In one embodiment, a set is selected by solving a selection problem to simultaneously select a sequence of primitives based on the selected inter-primitive anchorings. The selection can balance inaccuracies resulting from primitives based on modified parts and the difficulty of constructing necessary guidelines of the inter-primitive anchoring options. The resulting tutorials are thus both easy to use and accurate.

Tutorials produced using techniques of the invention provide steps that guide a user to draw a scaffold of primitives. The tutorial can include steps that instruct the user to use an inter-primitive anchoring so that primitives can be easily anchored (i.e., drawn with guidance) off one or more already-drawn primitives. For example, the steps of the tutorial can guide the user to draw guidelines using an already-drawn primitive that can be used to ensure that another primitive is drawn with accurate placement, alignment, and proportions. Exemplary guidelines are illustrated in FIG. 2. The tutorial can provide guidelines for drawing co-planar proportions such as the guidelines illustrated in graphical depictions 201-204 of FIG. 2. The tutorial can provide guidelines for drawing anchoring alignments such as the guidelines illustrated in graphical depictions 205. The tutorial can provide guidelines for proper perspective, such as the guidelines showing vanishing points illustrated in graphical depiction 206.

Given a 3D object (S) segmented into parts and a desired viewpoint, techniques of the invention determine an easy-to-follow sequence for drawing the object, starting with a scaffold and progressing to the contour details. The techniques make it easier to draw the scaffold by making small part-level geometric changes to facilitate easier inter-primitive anchorings. As illustrated in FIG. 2, various guideline techniques can be used to accurately draw guidelines at easy-to-construct ratios (1/2, 1/3 1/4, 1×, 2×, etc.). Object part placements and sizes in original object models, however, rarely conform to such ratios. Hence, techniques of the invention modify object parts so that they end up with part relationships that are easy to draw. Specifically, the techniques consider primitives for the parts of the object that are both based on the actual part geometry and based on slightly modified part geometry. Allowing such modifications can make the drawing easier without adding significant inaccuracy to the drawing. It should also be noted that the original primitives in tutorials are already approximations of real geometry and thus already contain some amount of error. Some of this error can be compensated by adjusting the fit of contours within the scaffold. In addition, accurate estimation of lengths and ratios is difficult, even for experts, so errors are almost unavoidable. By enforcing that primitives are anchored to one another based on relatively simple ratios for which reasonable geometric constructs can guide the user, the overall drawing error is unlikely to increase significantly beyond the unguided case.

Figure 3:
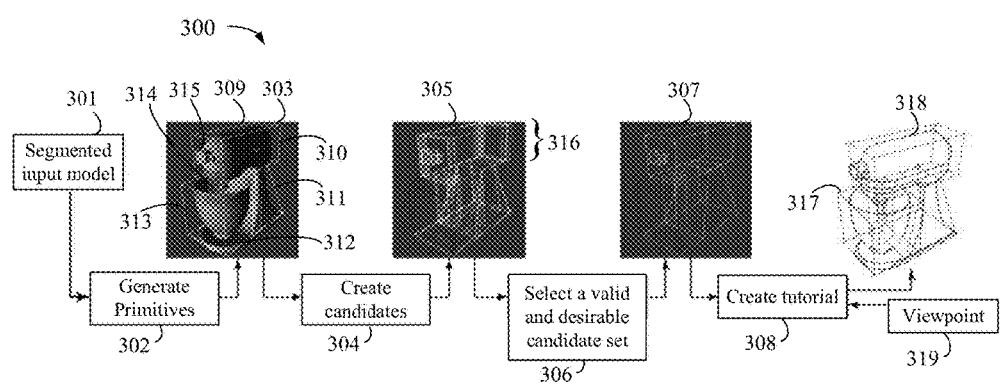
FIG. 3 is a flow chart graphically depicting a technique for providing a tutorial using primitives based on the geometry of the parts of the object

FIG. 3 is a flow chart graphically depicting a technique 300 for providing a tutorial using primitives based on the 3D geometry of the parts of the object. The exemplary technique 300 can be implemented by user device 102A and/or creative apparatus 108, although other devices and configurations can also be implemented. The exemplary technique 300 can be implemented by storing and executing instructions in a non-transitory computer-readable medium. Reference to the technique 300 being performed by a computing device includes the technique 300 being performed by one or more computing devices.

Technique 300 can be used to provide an easy-to-follow tutorial for drawing any object using any viewpoint. The technique 300 receives a segmented input model 301 for an object as input. The segmented input model includes three dimensional representations of the different parts of the object. A three dimensional model of an object can be based on a real world object or an artificially-created object. For example, to create a segmented model of a real world object, a user may take one or more pictures of the object and use a software application that uses the photo(s) to create a three dimensional model for the object. The software identifies the different parts of the object in the model. User input can additionally or alternatively be used to identify the parts of the object. For example, a user may use a user interface to draw boundaries around different object parts. Artificially-created three dimensional objects can be created in a variety of ways. In one example, a user uses a computer-aided-design (CAD) software application to produce a 3D model of an object.

A user can create a tutorial by identifying an object for the tutorial in various ways. In one example, the user selects a segmented 3D model from a database of existing segmented 3D models of different objects. In another example, the user creates his or her own segmented 3D model and selects the model for use in creating the tutorial. In another example, a user selects from drawings made by other tutorial users to identify an object for the tutorial. The segmented 3D model that was used in the prior tutorial is then selected and used to create a tutorial for the user.

Based on the segmented input model 301, the technique 300 performs three main stages to determine a scaffold for the tutorial. The technique first generates part-level primitives as shown in block 302. The primitives can be identified for the parts of the object based on the geometries of the parts in a 3 dimensional (3D) model of the object. This generally involves identifying a primitive having a type, size, and position that best fits each part in the 3D model. Determining primitives for the parts of an object is described further with reference to FIG. 4 below. In one embodiment, inter-primitive relations are also identified. Graphical depiction 303 illustrates original primitives 310, 311, 312, 313, 314, 316 identified for the parts of a food processing mixer object 309. Cuboid Primitive 310 represents the general shape of a mixer head, truncated pyramid primitive 311 represents the general shape of the mixer back, planar primitive 312 represents the general shape of the mixer base, cuboid primitive 313 represents the general shape of the mixer bowl, cuboid primitive 314 represents the general shape of the mixer beater, and cuboid primitive 315 represents the general shape of the mixer knob.

After generating the primitives, the technique 300 creates candidates, as shown in block 304. The candidates include the original primitives 310-315 generated in block 302 as well as the modified primitives. The modified primitives represent the shapes of the parts of the mixer with some modifications. Modified primitives are created by creating versions of the original primitives with axes, sides, and/or lines in variable locations. Examples of creating modified primitives are discussed with reference to FIG. 4 below. Graphical depiction 305 illustrates multiple primitives in slightly different locations identified for each of the parts of the food processing mixer object 309. For example, multiple primitives 316 are identified for the mixer head. Each candidate identifies a particular primitive for a part of the object being drawn using a particular inter-primitive anchoring option.

After creating the candidates, the technique 300 selects a valid and desirable candidate set, as shown in block 306. The set identifies one candidate for each part of the object and thus selects primitives that collectively provide a complete scaffold for the object. The set also identifies an inter-primitive anchoring option for each of the selected primitives. For example, an anchoring option may identify that primitive 311 is drawn based on primitive 310. The set is selected based on the accuracy of the primitives and the difficulty of the inter-primitive anchoring options. Techniques for selecting the set based on accuracy and difficulty are discussed with reference to FIG. 4 below. Because the selected set include inter-primitive anchoring options that specify drawing relationships between primitives, the set provides an ordering for drawing the primitives to draw the scaffold. For example, if an inter-primitive anchoring specifies that primitive 311 is drawn based on primitive 310, primitive 310 must be drawn before primitive 311. Moreover, the selected set implicitly encodes geometric modifications to the original parts since candidates that use modified primitives can be selected. By selecting a candidate set that satisfies certain criteria, the technique ensures that the selected candidates are sufficiently accurate and that the inter-primitive anchorings are sufficiently easy-to-use. The candidate set is selected to balance accuracy with ease of use. Techniques of the invention select the candidate set to provide an easy-to-follow primitive drawing sequence at the cost of deviating from the original geometry in a controlled fashion.

Technique 308 uses the selected candidate set and a viewpoint 319 to create a tutorial as shown in block 308. The viewpoint 319 can be determined by default or selected based on user input. For example, a user can specify a particular viewpoint for drawing a race car. In one embodiment, the user identifies a viewpoint by using 3D model viewer that centers the object in a view and then allows the user to tumble (rotate) the object as desired. In another embodiment of the invention, the user draws a real object from the user's real world environment. In this example, the viewpoint is determined using an apparatus that determines the relative location of the user to the real world object. The exemplary tutorial that is created in block 308 provides a sequence of steps that guide the user to first draw scaffold 317 and then draw contour lines relative to the scaffold 317 to produce a drawing 318 of the object.

Figure 4:
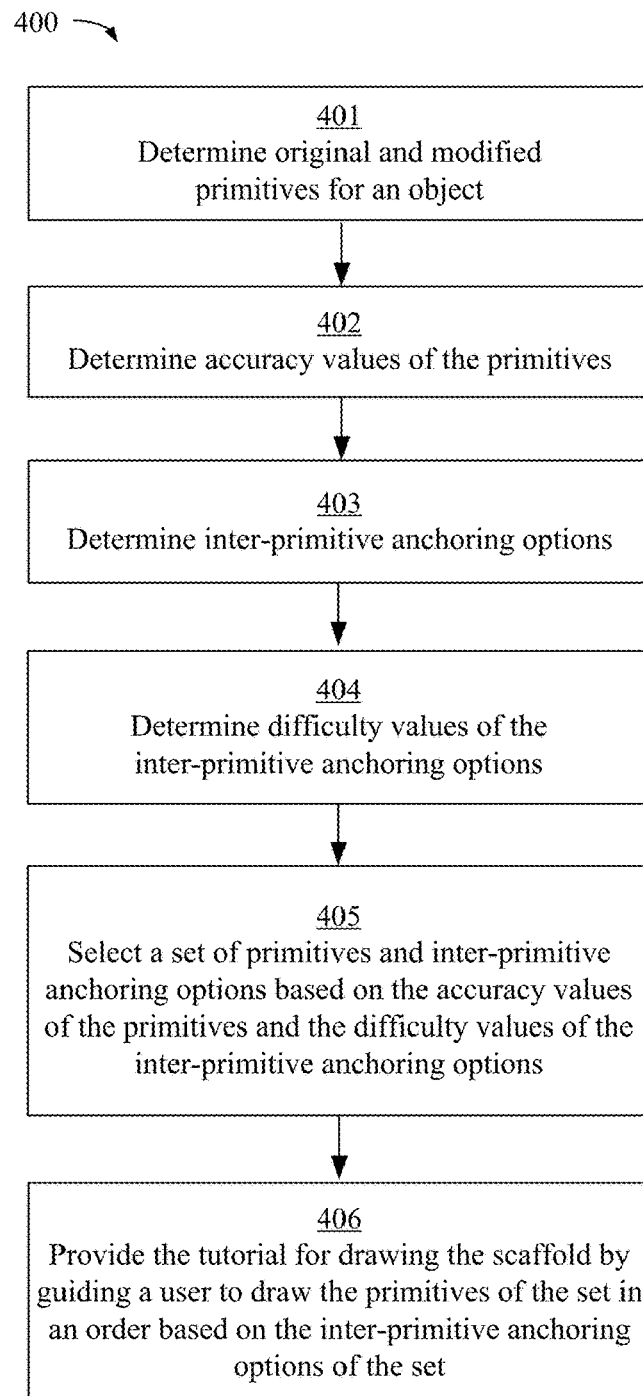
FIG. 4 is a flow chart illustrating an exemplary technique for providing a tutorial for drawing a scaffold to guide a drawing of a three dimensional object.

FIG. 4 is a flow chart illustrating an exemplary technique 400 for providing a tutorial for drawing a scaffold to guide a drawing of a three dimensional object. The exemplary technique 400 can be implemented by user device 102A and/or creative apparatus 108, although other devices and configurations can also be implemented. The exemplary technique 400 can be implemented by storing and executing instructions in a non-transitory computer-readable medium. Reference to the technique 400 being performed by a computing device includes the technique 400 being performed by one or more computing devices.

The technique 400 involves determining original and modified primitives for an object, as shown in block 401. The original primitives represent the general shapes (planes, cuboids, cylinders, and truncated pyramids, etc.) of the parts of a three dimensional model of the object. The original primitives can be identified for the parts of the object based on the geometries of the parts in a 3D model of the object. This generally involves identifying a primitive having a type, size, and position that best fits each part in the 3D model. In one example, for each part of the 3D model S, a least-squares technique is used to fit (axis-aligned) different primitive types to the part and the primitive type with the least residue is selected for the part. Specifically, for a given primitive type, the least squares technique is used to identify a size and position of a primitive of that primitive type that best fits the part in the 3D model. The best-fitting primitives of each of the different primitive types are then compared with one another. For example, the best-fitting plane primitive, the best-fitting cuboid primitive, the best-fitting cylinder primitive, the best-fitting truncated pyramid primitive, etc. are compared and the primitive that best fits the part is selected. Since the residue from the respective least-square determinations provides a measure of how well each primitive fits the part, the residues can be compared to determine the primitive that best fits the part. In case of ties, the simpler primitive is chosen. In this way, the technique identifies an original primitive that accurately represents the shape of the part.

The modified primitives represent the general shapes of the parts of the object with modifications. In one embodiment, modified primitives are created by modifying an original primitive to provide new primitives with one or more different axes, sides, and/or lines. For example, modified primitives can be created from an original cylinder primitive by shifting an axis of the original cylinder primitive to new positions. Modified primitives can be created with the axis shifted by different increments and in different directions relative to the position of the axis in the original primitive. For example, a first modified primitive has the axis shifted 0.1 cm in a first direction, a second modified primitive has the axis shifted 0.2 cm in the first direction, a third modified primitive has the axis shifted 0.3 cm in a first direction, a fourth modified primitive has the axis shifted 0.1 cm in a second direction. Similarly, modified primitives can provide new primitives with a side or line of an original primitive shifted by particular incremental values and in one or more directions.

The number and variety of modified primitives can be based on predetermined criteria. For example, modified primitives may be created according to criteria that creates all possible modified primitives with shifts within a certain value range (e.g., creating primitives using all variations that shift an axis, side, or line of the original primitive 1 cm or less) and using predetermined shift increments (e.g., using shift increments of 0.1 cm). The modified primitives can include different combinations of changes to the axes, sides, and lines of the original primitive. For example, a modified primitive may both change an axis of the original primitive and change an edge of the original primitive. Embodiments of the invention can create a large number of thousands, millions, or even more modified primitives. The number of primitives increases with the number of parts of the object and the number of modified primitives determined for each of the parts. The criteria used to determine the modified primitives can be configured to ensure that at least a predetermined minimum number of primitives will be determined for each part or for the object generally. Ensuring a minimum number modified primitives can provide greater flexibility in selecting a set of primitives that is easy to draw. The criteria for determining modified primitives can additionally or alternatively limit the maximum number of modified primitives that will be determined for each part or for the object generally. Limiting the maximum number of primitives can reduce the computational complexity of the processes used to determine the primitives for the scaffold and those improve the speed and efficiency of the process.

The technique 400 involves determining accuracy values of the primitives, as shown in block 402. The accuracy values quantify how accurately the primitives represent the general shapes of the parts of the object. Accordingly, the original primitive identified for a part will generally provide the most accurate representation of that shape. The modified primitives will represent the general shape of the part with less accuracy. Accordingly, certain embodiments determine the accuracy values of the primitives for each part relative to the original primitive for that part. The accuracy values can be determined, for example, by measuring deviations of the modified primitives relative to the original primitive to measure their inaccuracies. In this example, the accuracy values represent deviations and thus larger accuracy values represent greater inaccuracy. Using such a technique, the original primitive is assigned an accuracy value, such as zero, representing that it is the most accurate primitive. The modified primitives will each have some deviation from the original primitive and thus are assigned higher values based on the amount of deviation. In one example, the accuracy value of a modified primitive is based on how much the center of the modified primitive differs from the center of the original primitive. The accuracy values can be assigned proportionally based on the amount of deviations. For example, a modified primitive with a center that is 1 cm different from the center of the original primitive can be assigned an accuracy value of 1, a modified primitive with a center that is 2 cm different from the center of the original primitive can be assigned an accuracy value of 2, etc.

In other examples, changes in the axes, sides, and lines of the original primitive in a modified primitive are used to determine the accuracy values of the modified primitive. For example, if the axis of a modified primitive is shifted relative to the corresponding axis of the original primitive, the distance of the shift can be used to determine an accuracy value. Similarly, differences in the positions of sides and lines between the modified primitive and the original primitive can be used to determine the accuracy value. In one embodiment, the differences of a modified primitive with respect to the axes, sides, and lines of the original primitive are combined to determine the overall accuracy value of each modified primitive.

Figure 5:
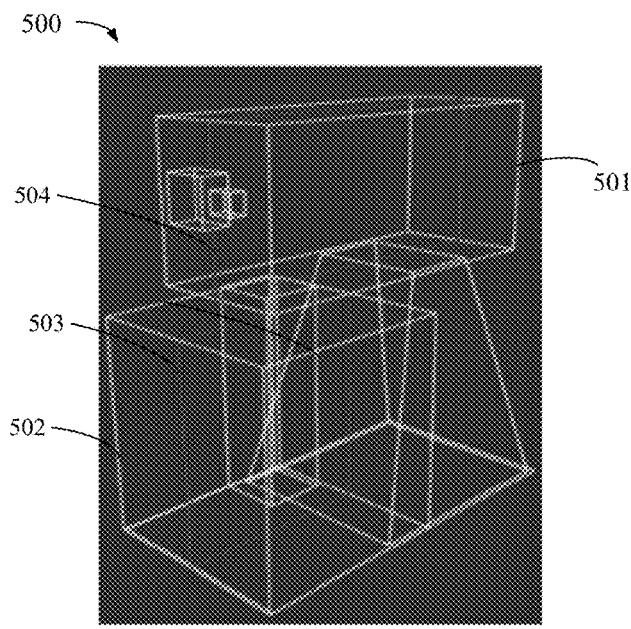
FIG. 5 is a graphical depiction of a coaxial relationship between two primitives.

The technique 400 can also involves determining relationships between the parts of the object. Man-made objects often have dominant inter-part relations. It is generally desirable to preserve such relations in the generated tutorials to ensure the accuracy of the drawing. In technique 400, such inter-part relationships are detected so that they can be preserved by the tutorial generated later in the process. In one embodiment of the invention, determining relationships between parts of an object involves testing each pair of primitives $P_i$ and $P_j$ for any relationships. Various types of relationships can be considered. Examples of relationships include coplanar relationships between primitives or primitive faces, coaxial relationships between primitive axes, and common bisector plane relationships between primitives. FIG. 5 provides a graphical depiction of a common bisector plane relationship between two primitives 501, 502. The bisector plane 503 of primitive 501 is on the bisector plane 504 of primitive 502.

If multiple relationships are identified between a given pair of primitives, a relationship can be selected based the type of the relationship. In one example, common bisector plane relationships are preferred over coaxial relationships, which are preferred over coplanar relationships. In the following description, a relationship is denoted using a binary variable $R_{i,j}$ where i and j respectively denote the primitives $P_i$ and $P_j$. The type of relationship is not explicitly indicated in this notation. If a relation is present, we mark $R_{i,j}=1$, and $R_{i,j}=0$ otherwise.

Returning to FIG. 4, the technique 400 next determines inter-primitive anchoring options, as shown in block 403. This can involve identifying all possible inter-primitive anchoring options for a given primitive. For example, if there a 100 primitives, identifying the inter-primitive anchoring options for a given primitive can involve determining an inter-primitive anchoring option for drawing the primitive based on each of the other 99 primitives. In one embodiment, each primitive and inter-primitive anchoring is considered to be a candidate for inclusion in the tutorial. Thus, if there are ten inter-primitive anchoring options for a given primitive there will be 10 candidates, i.e., one candidate identifying the primitive and a respective inter-primitive anchoring option.

The following example illustrates an exemplary technique for determining candidates that will include the primitives using a variety of different inter-primitive anchoring options. The notation $C_{*,i}$ is used to denote the set of all the primitives generated corresponding to primitive part $P_i$. Since the original primitive is always included, the technique starts with $C_{*,i}:=\{P_i\}$. The candidates are then generated in three stages.

In the first stage, for each pair of primitives $P_i$ and $P_1$, candidates are generated in the form $C_{j \to i}^k$, where $j \to i$ indicates that a candidate is generated for primitive part $P_i$ and is anchored off $P_j$ with k denoting the different inter-primitive anchoring options. For example, parts can be anchored based on different guidelines for different face- or plane-based anchors. The generated candidates are then appended to the respective candidate sets as:

$$C_{*i} \leftarrow C_{*i} \cup \{C_{j \to i}^1, C_{j \to i}^2, \ldots\}$$

Figure 6:
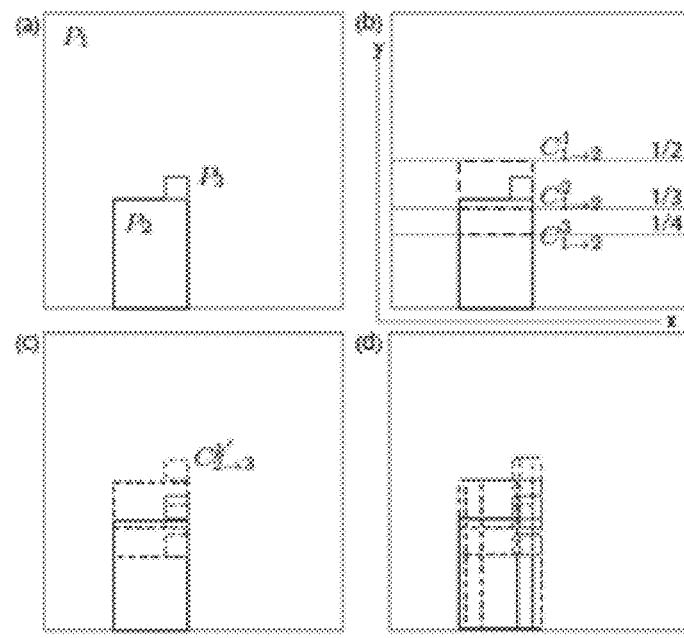
FIG. 6 is a set of graphical depictions illustrating the creation of candidates.

FIG. 6 is a set of graphical depictions illustrating the creation of candidates. Graphical depiction (a) illustrates an initial set of primitives $P_1$, $P_2$, $P_3$. For each pair of primitives, the technique generates several adjusted candidates. Candidates are generated for each axis independently. For example, graphical depiction (b) illustrates how using $P_1$ as a parent, several $P_2$ candidates are created by aligning its top edge to the ½ ($C_{1 \to 2}^1$), ⅓ ($C_{1 \to 2}^2$) and ¼ ($C_{1 \to 2}^3$) guides on the y-axis.

In the second stage, the technique considers whether small part modifications introduced during the anchoring in stage (i) violate relations $R_{i,j}$. For each pair of primitives ($P_i$; $P_j$) sharing a relationship $R_{i,j}$, additional primitives are added to their candidate sets to restore the relationships. Specifically, corresponding to a candidate of the form $C_{i \to j}^{k'}$ (created in stage (i)), a new candidate of the form $C_{i \to j}^{k''}$ is created such that $C_{j \to i}^k \leftrightarrow C_{i \to j}^{k'}$ are similarly related as in $P_i \leftrightarrow P_j$. All such relationship-based additional candidates are appended to the respective candidate sets, i.e., $C_{*i} \leftarrow C_{*i} \cup D_{i \to j}^{k'}$. In graphical depiction (c) of FIG. 6, since P2 and P3 have a co-planar relation for each $C_{1 \to 2}^k$ candidate, a new P3 candidate ($C_{2 \to 3}^{k'}$) is generated restoring this relation. Note that in certain embodiments, a primitive is allowed to be anchored from one or multiple parents, as each axis can be independently anchored. Additionally, a candidate can be partially unguided (e.g., the width and length of cuboid is guided but the height is not) or completely unguided (e.g., it is simply the input primitive).

In the third stage, second-level anchors are considered. The additional primitives generated in the first two stages are considered as anchors for other primitives, creating a hierarchy. This can be accomplished by simply iterating to repeat stages (i) and (ii). The graphical depiction (d) of FIG. 6 illustrates repeating the processes of stages (i) and (ii) using the new candidates to produce second level primitives. Note that before starting stage (iii), the candidates with large changes in geometry or relative placements can be removed to avoid inaccuracies. At the end of this stage, there is a set of candidates for each part of the input model, resulting in the super set of candidate primitives of the form $\{C_{*i}\}$. The candidates provide numerous potential primitives using numerous potential inter-primitive anchoring options.

Returning to FIG. 4, the technique 400 determines difficulty values of the inter-primitive anchoring options, as shown in block 404. The inter-primitive anchoring options specify whether a given primitive will be drawn using a previously-drawn primitive as a guide or without using a previously-drawn primitive as a guide. Moreover, where a previously-drawn primitive is used as a guide, one or more guidelines may additionally be used to guide the drawing of the primitive. The difficulty values of the inter-primitive anchoring options are determined based on whether the options use previously-drawn primitives as a guide or not and/or the amount of guidelines that are used. Generally, drawing a primitive without using a previously-drawn parent primitive is considered more difficult than drawing the primitive using a previously-drawn parent primitive as a guide. Accordingly, inter-primitive anchoring techniques that do not use previously-drawn primitives as guides can be assigned relatively high difficulty values. The difficulty values assigned to the inter-primitive anchoring options that do use previously-drawn primitives as guides can depend on the number of guidelines that are required. Generally, the greater the number of guidelines, the more difficult the anchoring option. In one embodiment, the difficulty values assigned to the inter-primitive anchoring options varies proportionally with the number of guidelines. For example, an anchoring option requiring no guidelines can be assigned a zero difficulty value, an anchoring option requiring one guideline can be assigned a difficulty value of 1, an anchoring option requiring two guidelines can be assigned a difficulty value of 2, etc.

The technique 400 selects a set of primitives and inter-primitive anchoring options based on the accuracy values of the primitives and the difficulty values of the inter-primitive anchoring options, as shown in block 405.

In one embodiment, the selected set must include primitives that satisfy validity criteria. Not all potential sets of primitives and inter-primitive anchoring options will be valid. For example, a set that includes two primitives for a given part of the object will not be valid. Techniques of the invention identify valid sets and then select a set from the valid sets based on the accuracy values of the primitives and the difficulty values of the inter-primitive anchoring options.

The following discussion describes an exemplary technique for identifying valid sets and then selecting a set from the valid sets. The discussion uses indicator variables $\chi(X)$ to denote if a candidate primitive X is selected (i.e., $\chi(X)=1$) or not (i.e., $\chi(X)=0$). $\chi(C_{j \to i}^k) \in \{0, 1\}$ for each $C_{j \to i}^k \in C_{*i}$. $\Lambda$ denotes a particular assignment for the indicator variables for all the candidate primitives.

Among the various possible selections, not all the subsets of candidates of the form $\Lambda$ constitute valid selections. A valid selection of candidates (i.e., primitives using particular inter-primitive anchoring options) should satisfy three conditions. First, for each part of S, only one candidate primitive should be selected. Second, if a selected candidate primitive is anchored off one or more parent (candidate) primitives, then its parent primitive(s) must also be selected. Third, if any two primitives $P_i$ and $P_j$ share a relation, then their corresponding selected candidate primitives should also respect the same relation.

The above conditions are expressed in terms of the indicator variable in $\Lambda$. The first validity condition is encoded as:

$$\sum_{j,k} \chi(C_{j \to i}^k) = 1 \quad \forall\, i.$$

The second validity condition is encoded as a quadratic constraint involving the binary selection variables as:

$$\chi(C_{j \to i}^k)\chi(C_j) - \chi(C_{j \to i}^k) \geq 0$$

for each dependent pair $C_{j \to i}^k \in C_{*i}$ and its parent $C_j$. Note that this condition disallows $\chi(C_{j \to i}^k)=1$ AND $\chi(C_j)=0$, but allows any of the other three assignments involving $\chi(C_{j \to i}^k)$ and $\chi(C_j)$.

The third validity condition is also encoded. Let two primitives $P_i$ and $P_j$ share a relation, i.e., $R_{i,j}=1$. Let $C_{*i}=\{C_{*i}^1, C_{*i}^2, \ldots\}$ be all the generated candidates for primitive $P_i$ and similarly $\{C_{*j}^1, C_{*j}^2, \ldots\}$ for primitive $P_j$. Then for each pair of the form $C_{*i}^k \in C_{*i}$ and $C_{*j}^{k'} \in C_{*j}$ that does not share the same relation as the third condition requires:

$$\chi(C_{*i}^k)\chi(C_{*j}^{k'})=0.$$

This condition disallows $\chi(C_{*i}^k)=1$ AND $\chi(C_{*j}^{k'})=1$, i.e., they cannot be jointly selected as these candidate primitives do not share the same relations as of their respective primitive parts. A selection $\Lambda$ is valid if the three equations are all satisfied. Multiple valid selection sets are determined based on the candidates.

After identifying the multiple sets, a desirable set is selected based on the accuracy values of the primitives and the difficulty values of the inter-primitive anchoring options. The accuracy values represent the inaccuracies due to the changed geometries of the modified primitives. The difficulty values represent how difficult it is to draw a primitive using the inter-primitive anchoring option. The accuracy values can be used to determine an accuracy cost of using each of the sets and the difficulty values can be used to determine a difficulty cost of using each of the sets. A set can then be selected based on these costs.

The following provides an example of selecting a set of primitives and inter-primitive anchoring options based on accuracy costs and difficulty costs. In this example, the difficulty of drawing is modeled as the cost $E_e(C_{j \to i}^k)$ with a lower cost denoting easier to draw. The total cost is expressed as:

$$E_{difficulty}(\Lambda) := \sum_{i,j,k} \chi(C_{j \to i}^k) E_e(C_{j \to i}^k).$$

Selecting any primitive, however, incurs an associated error based on the accuracy values of the primitives. The error is indicated as $E_d(C_{j \to i}^k)$. The total error cost of selecting a set with particular primitives is:

$$E_{adjust}(\Lambda) := \sum_{i,j,k} \chi(C_{j \to i}^k) E_d(C_{j \to i}^k)$$

with a higher cost indicating larger inaccuracies (e.g., geometric deviations) from the original parts.

The final formulation for a desirable selection is:

$$\min_{\Lambda}(E_{adjust}(\Lambda) + E_{difficulty}(\Lambda))$$

subject to the validity conditions described above. This formulation provides a quadratically-constrained linear program that can be solved to select the set of primitives and inter-primitive anchorings for the tutorial. A linear solver can be used to solve the quadratically-constrained linear program.

The above formulation requires metrics for $E_e$ and $E_d$. Various metrics may be used. In one embodiment, for the difficulty of drawing term $E_e(C_{j \to i}^k)$, a higher cost is used for anchors that are harder to replicate (e.g., requiring more guidelines). Specifically, the cost can be set to the number of guidelines divided by the area of the parent plane where the lines are to be drawn. This encourages fewer guides but also using planes/faces with larger areas for drawing sketch guides.

In one embodiment of the invention, for the data error $E_d(C_{j \to i}^k)$, the changes in length along each axis, normalized by the original axis length, are summed with the translation of the midpoint of each axis, also normalized by the input axis length. For an unguided axis, the data error is set to the maximum of 2 to discourage unguided candidates.

The solution to the above optimization directly gives both the ordering and the size and location modifications of the parts. The ordering is represented as a directed graph, and the final linear ordering is determined via topological sorting. Note that the directed graph may have a fork in the ordering of candidate primitives. This implies that the relative drawing order of certain primitives are not specified. Such ties can be broken when the selected primitives and inter-primitive anchorings are used to produce the steps of a tutorial at runtime.

Parts of an object that are not well approximated by one of the supported primitive types can be represented as a custom primitive (e.g., a line). Such primitives would not be part of the optimization. Instead after the optimization, the custom primitive's relative positioning could be updated enforcing existing relational constraints with optimized primitives.

In one embodiment, the candidate primitive generation of the above formulation works in two steps. First, coplanar relations are used to generate candidate planes $c_{i \to j}^k$, and then depending on the primitive type, the planes are combined to create a complete primitive $C_{i \to j}^k$ (here, lowercase c for candidate plane rather than complete primitive that uses uppercase C). This choice unifies candidate primitive generation across primitive types.

For each pairwise coplanar relation $R_{i,j}$, there are two participating planes in $P_i$ and $P_j$. At this stage, the relation is undirected. Candidate planes are produced using both combinations $c_{j \to i}^k$ and $c_{i \to j}^k$. To generate a candidate plane, each axis is considered independently then all combinations are combined to create planes $c_{i \to j}^k$. An axis can be anchored by the parent plane using the end points of the same axis. This means there are several anchoring possibilities. For example, anchoring the vertical axis of $P_i$ and $P_j$ might involve anchoring the top edge of $P_i$ to the ⅓ line of $P_j$ and the bottom edge $P_i$ to the bottom edge of $P_j$. An alternative might be to anchor the top edge of $P_i$ to the ⅓ line of $P_j$ and the bottom edge $P_i$ to ¼ line of $P_j$. All candidates are initially generated. However, to reduce the number of candidates to select from, those with an axis length or translation change of more than a threshold (e.g., 10%) of the input length are discarded.

With all the candidate planes generated using all the pairwise relations, complete primitives are generated by combining the different planes based on primitive type. To generate a complete cuboid primitive, for example, the missing height axis from one of the other planes is found to complete the primitive. For truncated pyramids, top and bottom planes are combined with a height axis to make a truncated pyramid. This process is repeated using the first level candidates as the parent primitives to generate second level candidates.

After selecting the set of candidates, the technique 400 provides a tutorial for drawing the scaffold by guiding a user to draw the primitives of the set using the inter-primitive anchoring options of the set, as shown in block 406. Selecting the set provides a primitive ordering, drawing guidelines, and adjusted part geometry for drawing the scaffold of the object. A tutorial is automatically produced using this information. The tutorial can be adapted further based on a user-chosen viewpoint and user-indicated drawing level (novice/apprentice/master), which can be controlled interactively. The tutorial can provide indications of when guidelines can be erased and provide hints for drawing in perspective and object contours.

Embodiments of the invention use a user-specified viewpoint to customize the tutorial. Although primitive ordering is determined based on the inter-primitive anchoring options, multiple primitives can anchor from the same parent primitive, resulting in a tie. Such ties can be broken by first choosing the primitive that is closest to the user from an indicated viewing position. In addition, the selected viewpoint can make some guidelines cumbersome to draw because of limited space on the projected area of a primitive face. Such instances can be identified by thresholding based on $A_p/k$, where $A_p$ indicates the projected area and k the number of guidelines necessary to draw the primitive. If a primitive falls below this threshold, the user is instructed to simply 'eyeball' the primitive without drawing intermediate guides. Finally, a segment that is occluded and its primitive does not help anchor any other visible primitive is deemed unnecessary and hence is left out from the tutorial.

Embodiments of the invention provide the tutorial by taking into account the user's ability. In one embodiment of the invention, the tutorial for a given object is adapted to different abilities by classifying the various guidelines as suitable for novice, apprentice, or master users. For example, dividing a face of a primitive into halves requires three guidelines. A novice is shown all the three, an apprentice only the ½ line itself, and a master is not provided with any intermediate guidance. Note that in all of these cases, the user is instructed to divide the highlighted face into half by a text label in the viewer.

Embodiments of the invention also limit guideline lifetime in the tutorial. In order to reduce the amount of guidelines on a drawing at any point in time, each guideline's lifetime is tracked to inform the user when a guide can be safely erased. An exemplary technique for limiting guideline lifetime, stores lifetimes for each of the guidelines and tracks when each guideline first appears and when a guideline was last used.

Embodiments of the invention also make the tutorial easier to use by distinguishing guidelines used in the tutorial. In one example, a guideline is drawn in orange when it first appears in the tutorial so that the user easily recognizes that the new guideline needs to be drawn. If the guideline is used in any later step, it is changes to blue. After the last step in which a guideline is used, it is no longer shown. As a result, users do not have to unnecessarily erase/redraw guides, and thus reduce clutter as they draw.

Embodiments of the invention also use vanishing points, vanishing lines, and ellipses to guide a user in a tutorial. In one embodiment, vanishing lines and vanishing points are indicated with respect to the paper boundary to help the user better position the lines. Ellipses can be used to reproduce circles in perspective, for example, to construct a cylinder from a cuboid. The tutorial can additionally guide users to draw ellipses on a primitive face by using guides to the vanishing points. These guides intersect with the sides of the face at the perspective mid-points, which are the points where the ellipse should touch the face of the primitive.

Embodiments of the invention provide contour ordering for the tutorial. Once the user has sketched the scaffold and ellipses, the tutorial guides the user to draw the contours. One embodiment of the invention use suggestive contours computed on the modified underlying model segments—the contours are computed at a segment level. The contour segments are progressively displayed per segment, following the order determined by the primitives. Segments can be determined by, for example, changes in direction of curvature, so that the user can focus on drawing either straight lines or curves in a clockwise or counter-clockwise direction, one at a time. Already drawn parts are used to determine occlusion for the new primitives, thus reducing clutter.

Figure 7:
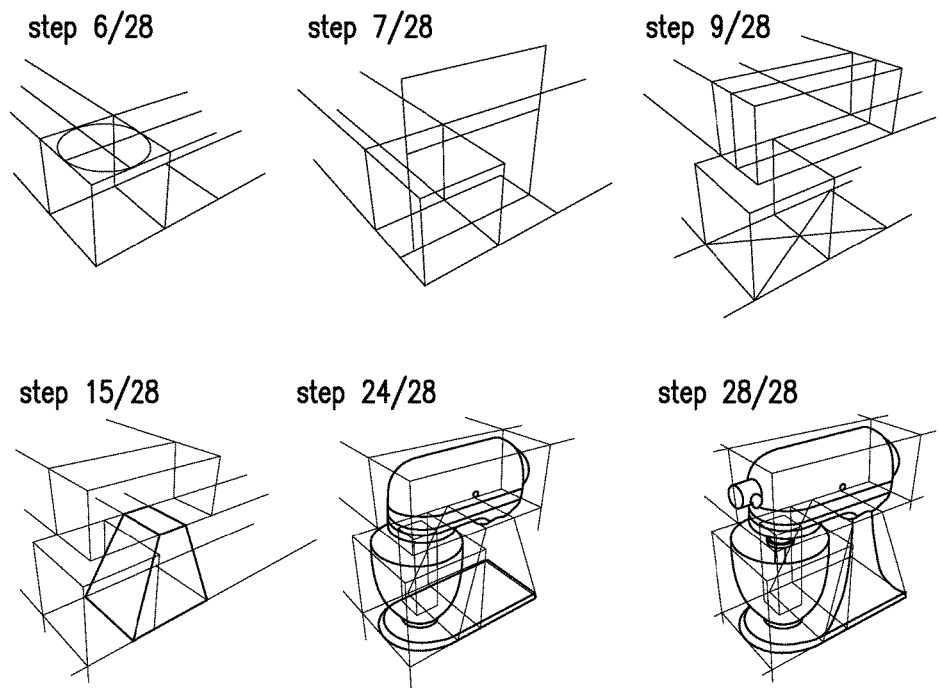
FIG. 7 is set of illustrations provided as steps in a tutorial to guide a user through a sequence of steps to draw a scaffold.
Figure 8:
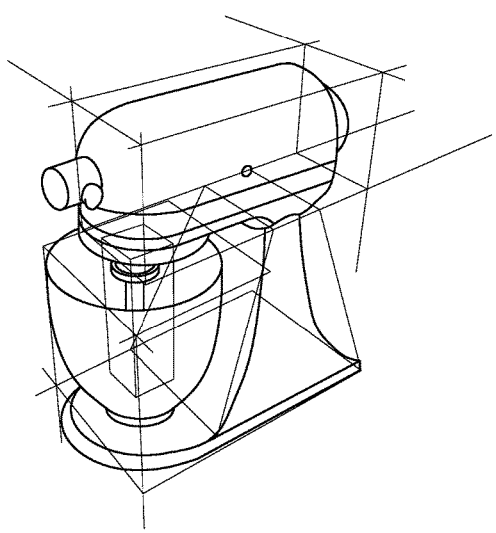
FIG. 8 is a user drawing of an object drawn using the tutorial of FIG. 7.

Embodiments of the invention provide tutorials in a variety of different forms. Tutorials can be produced for manual navigation using a user interface, printed, and/or sequenced into a video or slide-show presentation, as examples FIG. 7 is set of illustrations provided as steps in a tutorial to guide a user through a sequence of steps to draw a scaffold. The tutorial was automatically generated based on an intelligent selection of primitives and inter-primitive anchoring options. Illustrations for only a few of the many steps of the tutorial are shown in FIG. 7. At each step, the user is guided to draw one or more guidelines, primitive features, and/or contour lines. FIG. 8 is user drawing of an object drawn using the tutorial of FIG. 7.

Exemplary Computing Environment

Figure 9:
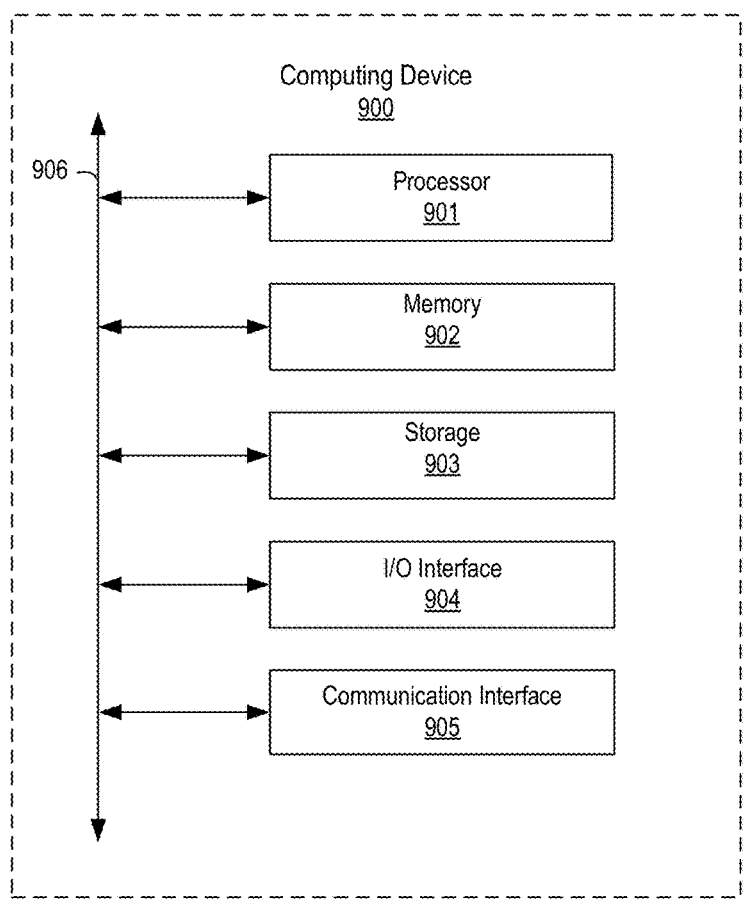
FIG. 9 is a block diagram depicting an example hardware implementation.

Any suitable computing system or group of computing systems can be used to implement the techniques and methods disclosed herein. For example, FIG. 9 is a block diagram depicting examples of implementations of such components. The computing device 900 can include a processor 901 that is communicatively coupled to a memory 902 and that executes computer-executable program code and/or accesses information stored in memory 902 or storage 903. The processor 901 may comprise a microprocessor, an application-specific integrated circuit ("ASIC"), a state machine, or other processing device. The processor 901 can include one processing device or more than one processing device. Such a processor can include or may be in communication with a computer-readable medium storing instructions that, when executed by the processor 901, cause the processor to perform the operations described herein.

The memory 902 and storage 903 can include any suitable non-transitory computer-readable medium. The computer-readable medium can include any electronic, optical, magnetic, or other storage device capable of providing a processor with computer-readable instructions or other program code. Non-limiting examples of a computer-readable medium include a magnetic disk, memory chip, ROM, RAM, an ASIC, a configured processor, optical storage, magnetic tape or other magnetic storage, or any other medium from which a computer processor can read instructions. The instructions may include processor-specific instructions generated by a compiler and/or an interpreter from code written in any suitable computer-programming language, including, for example, C, C++, C#, Visual Basic, Java, Python, Perl, JavaScript, and ActionScript.

The computing device 900 may also comprise a number of external or internal devices such as input or output devices. For example, the computing device is shown with an input/output ("I/O") interface 904 that can receive input from input devices or provide output to output devices. A communication interface 905 may also be included in the computing device 900 and can include any device or group of devices suitable for establishing a wired or wireless data connection to one or more data networks. Non-limiting examples of the communication interface 905 include an Ethernet network adapter, a modem, and/or the like. The computing device 900 can transmit messages as electronic or optical signals via the communication interface 905. A bus 906 can also be included to communicatively couple one or more components of the computing device 900.

The computing device 900 can execute program code that configures the processor 901 to perform one or more of the operations described above. The program code can include one or more modules. The program code may be resident in the memory 902, storage 903, or any suitable computer-readable medium and may be executed by the processor 901 or any other suitable processor. In some embodiments, modules can be resident in the memory 902. In additional or alternative embodiments, one or more modules can be resident in a memory that is accessible via a data network, such as a memory accessible to a cloud service.

Numerous specific details are set forth herein to provide a thorough understanding of the claimed subject matter. However, those skilled in the art will understand that the claimed subject matter may be practiced without these specific details. In other instances, methods, apparatuses, or systems that would be known by one of ordinary skill have not been described in detail so as not to obscure the claimed subject matter.

Unless specifically stated otherwise, it is appreciated that throughout this specification discussions utilizing terms such as "processing," "computing," "calculating," "determining," and "identifying" or the like refer to actions or processes of a computing device, such as one or more computers or a similar electronic computing device or devices, that manipulate or transform data represented as physical electronic or magnetic quantities within memories, registers, or other information storage devices, transmission devices, or display devices of the computing platform.

The system or systems discussed herein are not limited to any particular hardware architecture or configuration. A computing device can include any suitable arrangement of components that provides a result conditioned on one or more inputs. Suitable computing devices include multipurpose microprocessor-based computer systems accessing stored software that programs or configures the computing system from a general purpose computing apparatus to a specialized computing apparatus implementing one or more embodiments of the present subject matter. Any suitable programming, scripting, or other type of language or combinations of languages may be used to implement the teachings contained herein in software to be used in programming or configuring a computing device.

Embodiments of the methods disclosed herein may be performed in the operation of such computing devices. The order of the blocks presented in the examples above can be varied—for example, blocks can be re-ordered, combined, and/or broken into sub-blocks. Certain blocks or processes can be performed in parallel.

The use of "adapted to" or "configured to" herein is meant as open and inclusive language that does not foreclose devices adapted to or configured to perform additional tasks or steps. Additionally, the use of "based on" is meant to be open and inclusive, in that a process, step, calculation, or other action "based on" one or more recited conditions or values may, in practice, be based on additional conditions or values beyond those recited. Headings, lists, and numbering included herein are for ease of explanation only and are not meant to be limiting.

While the present subject matter has been described in detail with respect to specific embodiments thereof, it will be appreciated that those skilled in the art, upon attaining an understanding of the foregoing, may readily produce alterations to, variations of, and equivalents to such embodiments. Accordingly, it should be understood that the present disclosure has been presented for purposes of example rather than limitation, and does not preclude inclusion of such modifications, variations, and/or additions to the present subject matter as would be readily apparent to one of ordinary skill in the art.

What is claimed is:

1. A method, performed by a computing device, for providing a tutorial for drawing a scaffold to guide a drawing of a three dimensional object, the method comprising:
   receiving an object and a viewpoint, wherein the object is a three dimensional object;
   in response to receiving the object and the viewpoint, determining primitives for the object, the primitives comprising original primitives and modified primitives, the original primitives representing general shapes of parts of the object and the modified primitives representing the general shapes of the parts of the object with modifications;
   determining accuracy values of the primitives, the accuracy values quantifying how accurately the primitives represent the general shapes of the parts of the object;
   determining inter-primitive anchoring options for drawing the primitives based on guidelines drawn relative to previously-drawn primitives;
   determining difficulty values of the inter-primitive anchoring options based on amounts of the guidelines required by the inter-primitive anchoring options;
   selecting a set of primitives and inter-primitive anchoring options for a tutorial, wherein selecting the set is based on the accuracy values of the primitives and the difficulty values of the inter-primitive anchoring options; and
   outputting the set of primitives in an ordered sequence of steps for drawing a scaffold by guiding a user to draw the set of primitives in the ordered sequence of steps based on the inter-primitive anchoring options of the set.

2. The method of claim 1, wherein selecting the set comprises selecting the set from multiple candidate sets by solving an optimization, the optimization assigning inaccuracy costs based on the accuracy values of the primitives and difficulty costs based on the difficulty values of the inter-primitive anchoring options.

3. The method of claim 2, wherein the optimization identifies the ordered sequence of steps for drawing the set of primitives.

4. The method of claim 1, wherein the difficulty values of the inter-primitive anchoring options increase proportionally based on the amount of guidelines required by the inter-primitive anchoring options.

5. The method of claim 1, wherein determining the difficulty values of the inter-primitive anchoring options is based on predetermined difficulty values assigned to different types of the inter-primitive anchoring options.

6. The method of claim 1, wherein determining the difficulty values of the inter-primitive anchoring options comprises determining greater difficulty values for unanchored inter-primitive anchoring options than for anchored inter-primitive anchoring options.

7. The method of claim 1, wherein determining the accuracy values of the primitives comprises determining distances of centers of the modified primitives from centers of corresponding original primitives.

8. The method of claim 1, wherein selecting the set comprises:
   identifying multiple sets of different combinations of the primitives and inter-primitive anchoring options that satisfy validity criteria; and
   selecting the set from the multiple sets.

9. The method of claim 8, wherein the validity criteria require that valid sets include a single primitive for each of the parts of the object and include any parent primitives identified by associated inter-primitive anchoring options.

10. The method of claim 9, wherein the validity criteria further require that valid sets preserve relationships amongst original primitives.

11. The method of claim 10, wherein the relationships comprise a coaxial relationship between a first original primitive and a second original primitive.

12. The method of claim 1, wherein determining the inter-primitive anchoring options comprises identifying primitives in a same plane.

13. The method of claim 1, wherein outputting the set of primitives comprises outputting graphical depictions of how to construct the guidelines to anchor primitives to respective parent primitives.

14. The method of claim 1, wherein outputting the set of primitives comprises providing graphical depictions of how to draw contour lines relative to the scaffold.

15. A system for providing a tutorial having steps for drawing a scaffold to guide a drawing of a three dimensional object, the system comprising:
- a means for determining candidates responsive to receiving an object and a viewpoint, the candidates comprising individual primitives using different inter-primitive anchoring options as drawing guides, wherein the object is a three dimensional object;
- a means for selecting a set of the candidates to select primitives and inter-primitive anchoring options for a tutorial based on accuracy values of the primitives and difficulty values of the inter-primitive anchoring options; and
- a means for outputting the primitives of the set in an ordered sequence of steps for drawing a scaffold based on the selected set.

16. The system of claim 15, wherein the means for determining the candidates:
- determines the primitives for the object, the primitives comprising original primitives and modified primitives, the original primitives comprising geometric shapes generated based on parts of the object, the modified primitives determined by modifying locations of primitive lines of the original primitives, wherein individual parts of the object are approximated by multiple primitives having primitive lines in different locations;
- determines the inter-primitive anchoring options for the primitives, the inter-primitive anchoring options using different parent primitives as drawing guides for individual primitives; and
- determines the candidates based on the determined primitives and inter-primitive anchoring options.

17. The system of claim 15, wherein the means for selecting the set selects the set from multiple sets by solving an optimization, the optimization assigning costs to deviations from the original primitives based on the accuracy values and difficulty of the inter-primitive anchoring options based on the difficulty values.

18. The system of claim 15, wherein the means for selecting the set identifies multiple sets of different combinations of the candidates and inter-primitive anchoring options that satisfy validity criteria and selects the set from the multiple sets.

19. A non-transitory computer-readable medium storing instructions, the instructions comprising instructions for:
- determining primitives to approximate parts of an object, wherein individual parts of the object are approximated by multiple primitives having primitive lines in different locations and the object is a three dimensional object;
- determining inter-primitive anchoring options for drawing the primitives;
- selecting a set of primitives and inter-primitive anchoring options for a tutorial, wherein selecting the set is based on error criteria and difficulty criteria; and
- outputting the set of primitives in an ordered sequence of steps for drawing a scaffold based on the selected set.

20. The non-transitory computer-readable medium of claim 19, wherein selecting the set comprises selecting the set from multiple sets by solving an optimization, the optimization assigning costs to deviations from original primitives and difficulty of the inter-primitive anchoring options.

* * * * *